US005553273A

United States Patent [19]
Liebmann

[11] Patent Number: 5,553,273
[45] Date of Patent: Sep. 3, 1996

[54] VERTEX MINIMIZATION IN A SMART OPTICAL PROXIMITY CORRECTION SYSTEM

[75] Inventor: Lars W. Liebmann, Poughquag, N.Y.

[73] Assignee: International Business Machines Corporation, Armonk, N.Y.

[21] Appl. No.: 423,597

[22] Filed: Apr. 17, 1995

[51] Int. Cl.[6] .............................. H01L 21/027; G03F 7/00
[52] U.S. Cl. .......................... 395/500; 395/921; 364/491; 250/492.2; 430/297
[58] Field of Search ................................ 395/500, 920, 395/921, 919; 364/488, 489, 490, 491, 478; 250/492.2, 492.22; 382/144, 145, 170, 283; 430/5, 297, 302, 311, 313, 314

[56] References Cited

U.S. PATENT DOCUMENTS

| | | | |
|---|---|---|---|
| 4,426,584 | 1/1984 | Bohlen et al. | 250/492.2 |
| 4,520,269 | 5/1985 | Jones | 250/492.2 |
| 4,812,962 | 3/1989 | Witt | 364/490 |
| 4,895,780 | 1/1990 | Nissan-Cohen et al. | 430/5 |
| 5,159,201 | 10/1992 | Frei | 250/492.2 |
| 5,182,718 | 1/1993 | Harafuji et al. | 364/490 |
| 5,208,124 | 5/1993 | Sporon-Fiedler et al. | 430/5 |
| 5,278,421 | 1/1994 | Yoda et al. | 250/492.22 |
| 5,424,154 | 1/1995 | Borodovsky | 430/311 |
| 5,432,714 | 7/1995 | Chung et al. | 364/525 |

OTHER PUBLICATIONS

Eikichi et al., "Characterization of Microstrip Lines near a Subshate Edge & Deejn Formulas of Edge–Compensated Microstrip Lines", IEEE 89, pp. 890–896.

Chong et al., "Enhancement of Lithographic Patterns by Using Serif Feature", IEEE Dec. 1991, pp. 2599–2603.

Timothy, "Optical/Laser Microlithography VII", SPIE–International Society for Optical Engineering 1994, pp. 277–293.

William et al., "14th Annual Symposium on Photomask Technology and Management", SPIE–The International Society for Optical Engineerg. 1994, pp. 217–228.

Richard C. Henderson and Oberdan W. Otto, "CD Data Requirements for Proximity effect corrections," *14th Annual BACUS Symposium* Proc. SPIE 2322 1944 pp. 218–228.

Oberdan W. Otto, et al., "Automated Optical Proximity Correction–a rules–based Approach," *Optical/Laser Microlithography VII*, Proc. SPIE 2197 1994 pp. 278–293.

John P. Stirniman and Michael L. Rieger, "Fast Proximity correlation with zone sampling," *Optical/Laser Micro. VII*, Proc. SPIE 2197 1994 pp. 294–301.

John P. Stirniman and Michael Rieger, "Optimizing Proximity correction for wafer fabrication process," *14th Annual BACUS Symposium* Proc. SPIE 2322 1994 pp. 239–246.

Primary Examiner—Kevin J. Teska
Assistant Examiner—Tan Nguyen
Attorney, Agent, or Firm—Whitham, Curtis, Whitham & McGinn; Charles W. Peterson, Jr.

[57] ABSTRACT

An optical proximity correction (OPC) routine that enhances the fidelity of VLSI pattern transfer operations such as photolithography and reactive ion etch (RIE) by predistorting the mask while biasing only critical features and eliminating, as much as possible, the creation of additional vertices. The OPC routine accomplishes corrections in a timely and cost effective manner on realistic data sets without causing unnecessary increase in data volume. The OPC method employs a series of shrink, expand and subtraction operations that separate complex computer aided design (CAD) data for a lithography mask or reticle into sets of basic rectangles. More particularly, the OPC method first identifies a plurality of gate regions in a CAD design. A plurality of design shapes in the CAD design are sorted according to geometric type. A plurality of sorted design shapes share at least one side with a second design shape. The sorted design shapes are then grouped according to width. Finally, all of the grouped design shapes having been identified as gate regions are biased based on applicable OPC rules.

5 Claims, 16 Drawing Sheets

VERTEX MINIMIZATION IN A SMART OPTICAL PROXIMITY CORRECTION SYSTEM

BACKGROUND OF THE INVENTION

1. Field of the Invention

The present invention generally relates to the manufacture of very large scale integrated (VLSI) circuit devices and, more particularly, to the fidelity enhancement of lithographic and reactive ion etched (RIE) images through the use of optical proximity correction (OPC).

2. Background Description

Manufacturing of semiconductor devices is dependent upon the accurate replication of computer aided design (CAD) generated patterns onto the surface of a device substrate. The replication process is typically performed using optical lithography followed by a variety of subtractive (etch) and additive (deposition) processes. Optical lithography patterning involves the illumination of a metallic coated quartz plate known as a photomask which contains a magnified image of the computer generated pattern etched into the metallic layer. This illuminated image is reduced in size and patterned into a photosensitive film on the device substrate. As a result of the interference and processing effects which occur during pattern transfer, images formed on the device substrate deviate from their ideal dimensions and shape as represented by the computer images. These deviations depend on the characteristics of the patterns as well as a variety of process conditions. Because these deviations can significantly effect the performance of the semiconductor device, many approaches have been pursued which focus on CAD compensation schemes which ensure a resultant ideal image.

The performance enhancement of advanced VLSI circuitry (that is, the speed enhancement versus dimension reduction of the circuits) is increasingly limited by the lack of pattern fidelity in a series of lithography and RIE processes at small dimensions (e.g., sub 0.5 μm). In the photolithography process, a pattern is transferred from a photomask to a photosensitive film (resist) on the wafer. In the RIE process, this pattern in the resist is transferred into a variety of films on the wafer substrate.

An alternative to the costly development of processes with every higher effective resolution is the selective biasing of mask patterns to compensate for the pattern distortions occurring during wafer processing. The term Optical Proximity Correction (OPC) is commonly used to describe this process of selective mask biasing, even though the trend exists to include pattern distortions unrelated to the optical image transfer. The idea of biasing patterns to compensate for image transfer infidelities has been commonly applied to E-beam lithography to counteract the effects of back scattered electrons, both in the writing of photo masks and in direct wafer writing operations. See for example U.S. Pat. No. 5,278,421.

OPC extends the use of the automatic pattern biasing concept to the two major pattern transfer processes used in VLSI technologies. Current implementations of OPC can be categorized as "rules-based" in which patterns are sorted and biased in the computer aided design (CAD) data set based on rules relating bias amounts to pattern attributes such as size, proximity, and density, and "convolution-based" in which CAD patterns are biased based on particular pattern environment. Both the rules and convolution functions can be generated either from process simulations or empirical data.

For examples of "rules-based" OPC implementations, see Richard C. Henderson and Oberdan W. Otto, "CD data requirements for proximity effect corrections", 14*th Annual BACUS Symposium on Photomask Technology and Management*, William L. Brodsky and Gilbert V. Shelden, Editors, Proc. SPIE 2322 (1994), pp. 218–228, and Oberdan W. Otto, Joseph G. Garofalo, K. K. Low, Chi-Min Yuan, Richard C. Henderson, Christophe Pierrat, Robert L. Kostelak, Shiela Vaidya, and P. K. Vasudev, "Automated optical proximity correction—a rules-based approach", *Optical/Laser Microlithography VII*, Timothy A. Brunner, Editor, Proc. SPIE 2197 (1994), pp. 278–293. For examples of the "convolution-based" OPC implementations, see John P. Stirniman and Michael L. Rieger, "Fast proximity correlation with zone sampling", *Optical/Laser Microlithography VII*, Timothy A. Brunner, Editor, Proc. SPIE 2197 (1994), pp. 294–301, and John Stirniman and Michael Rieger, "Optimnizing proiximity correction for wafer fabrication processes", 14*th Annual BACUS Symposium on Photomask Technology and Management*, William L. Brodsky and Gilbert V. Shelden, Editors, Proc. SPIE 2322 (1994), pp. 239–246. The common characteristic of these implementations that is most relevant to the present invention is that CAD data are treated as a collection of geometric shapes, rather than designs defining device functionality.

There are two major drawbacks with the current implementations. The first is that using the accuracy of the pattern replication of either the lithography or RIE processes as a success criterion for the OPC, rather than the improvement of device functionality, drives a lot of unnecessary biasing. This increases the cost of the OPC process by complicating the CAD data sets and design rule checking decks and by increasing the CAD, mask writer, and inspection tool data volumes without adding any value to the VLSI chip. This is true for one-dimensional compensations focusing on the correction of line widths, as well as two-dimensional corrections dealing with phenomena such as corner rounding. The second problem relates to the addition of new vertices (jogs and corners) in the CAD layout which significantly increases the data volume and complicates mask inspection. The goal of an efficient OPC routine has to be the minimization of vertices added in the biasing process.

SUMMARY OF THE INVENTION

It is therefore an object of the present invention to provide a method and apparatus for improving the efficiency, i.e, the cost to benefit ratio, of the OPC process.

It is another object of the invention to provide an OPC routine that biases only critical features and eliminates, as much as possible, the creation of additional vertices.

It is a further and more specific object of the invention to provide a proximity correction routine that accomplishes corrections in a timely and cost effective manner on realistic data sets without causing unnecessary increase in data volume.

According to the invention, there is provided an improved optical proximity correction method and apparats which biases critical portions of the design level in a manner that does not unduly increase the data volume defining the circuit. The invention implements a hierarchical design rule checking (DRC) system with basic CAD capabilities and supports Boolean operations to improve the efficiency of OPC for VLSI processing by identifying functionally relevant features prior to pattern compensation. The invention is based on simple geometric operations for isolating existing edges in a CAD layout to allow feature biasing without the addition of new vertices.

More particularly, the invention employs a series of shrink, expand and subtraction operations to fracture the CAD pattern data into basic rectangles abutting at vertices existent in the original design. The thus defined rectangles are then classified as to their functional relevance based on their spatial relation to prior or subsequent CAD design levels. By shifting the edges of only the basic rectangles deemed relevant for the improvement of the VLSI device performance, the generation of new vertices is minimized and effort is expended only on high value add portions of the circuit design. The actual proximity classification and biasing can occur, as with the existing implementations, based on rules, convolution functions, or any combination thereof.

In a specific example, a plurality of gate regions in a CAD design is first identified. A plurality of design shapes in the CAD design are sorted according to geometric type. A plurality of sorted design shapes share at least one side with a second design shape. The sorted design shapes are then grouped according to width. Finally, all of the grouped design shapes having been identified as gate regions are biased based on applicable OPC rules.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
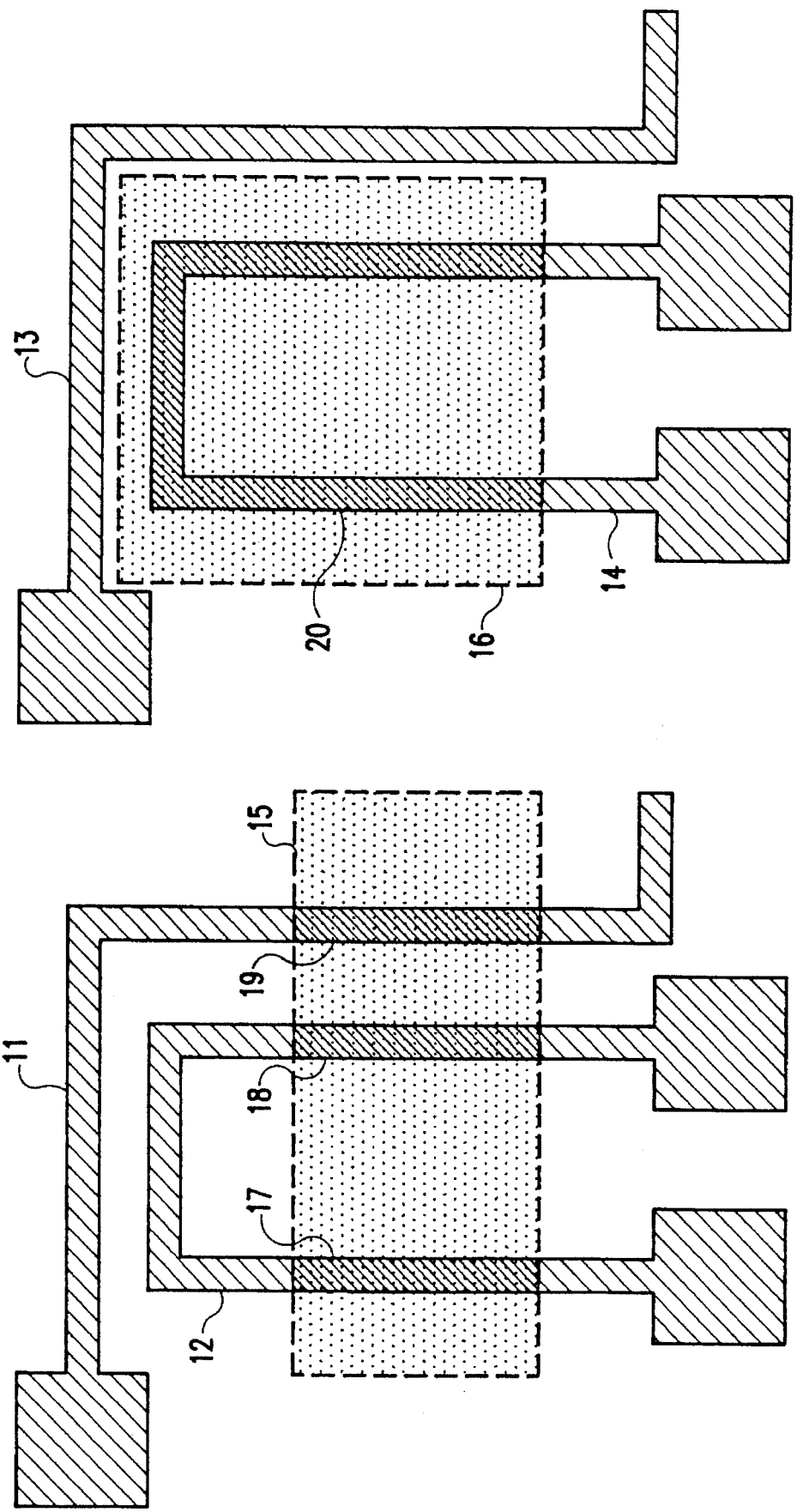
FIG. 1 is a plan view showing the critical regions on a gate level in a CMOS device.

Referring now to the drawings, and more particularly to FIG. 1, there is shown an example of a gate level in a CMOS device. The critical regions are defined by the intersections of the shapes defining the polysilicon gates 11, 12, 13, and 14 and the shapes 15 and 16 defining the diffusions. Looking only at the polysilicon gate level designs, the two patterns are identical. However, adding knowledge of the placement of the diffusions, it can be seen that the proximity correction in the left layout can be limited to the three vertical lines 17, 18 and 19, while in the right layout, a more complicated U-shaped pattern 20 has to be corrected.

Figure 2:
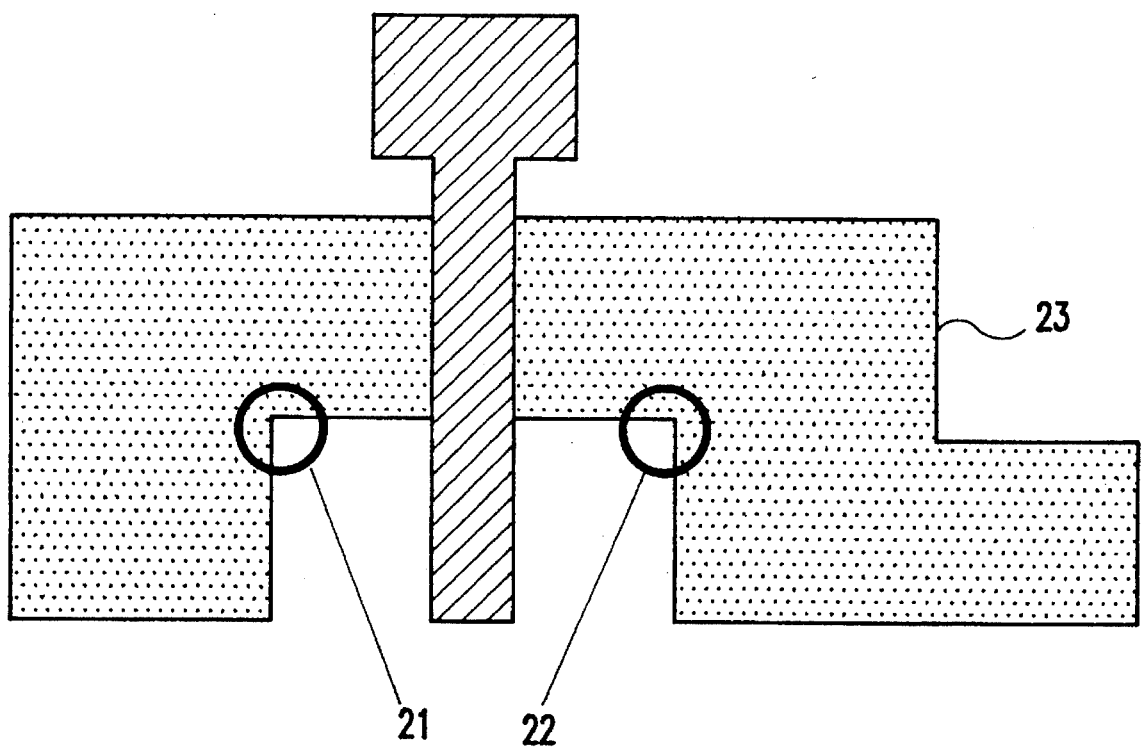
FIG. 2 is a plan view showing critical corners in a diffusion polygon which are relevant for OPC.

FIG. 2 shows another example of a gate level in a CMOS device which illustrates two critical corners 21 and 22 in the diffusion 23. In two-dimensional OPC approaches, edge decorations or serifs are used to counter the effects of corner rounding. In the polygon defining the diffusion 23, only the corners 21 and 22 are relevant for OPC due to a reduced overlay tolerance in the case of corner rounding.

The OPC routine according the present invention consists of three sorting and one biasing routine, explained here on the example of a gate conductor (GC) level. The first sorting routine locates all active gate regions in a polysilicon design by intersecting the GC level shapes with the diffusion level shapes. The second sorting routine independently breaks the design data down into geometric shapes (mostly rectangles) that terminate at existing line jogs or line ends. This geometric sorting is accomplished through a series of shrink, expand, and subtraction operations. The shrink operation eliminates all shapes (either stand alone geometries or geometric appendages) that are smaller than the specified shrink parameter. The expand operation returns the remaining data to its original size. A subtraction of this new data set from the original polysilicon design results in shapes of a specific width. Repeating these shrink, expand and subtract operations over a range of shrink values, separates the data into geometric shapes of increasing size. Since the change in feature size has to occur at an existing jog in the designed data, the boundaries of these shapes fall onto existing jogs. The final sort operation selects only those geometric shapes that actually coincide with active gate regions located in the first sorting operation. The biasing operation which now assigns a feature size alteration to the "gate containing shapes" first of all biases active gate regions in their entirety, without the risk of violating design rules, and secondly minimizes the number of additional vertices by ensuring that vectors of geometric shapes are moved at points where at least one vertex existed in the original design.

Figure 3:
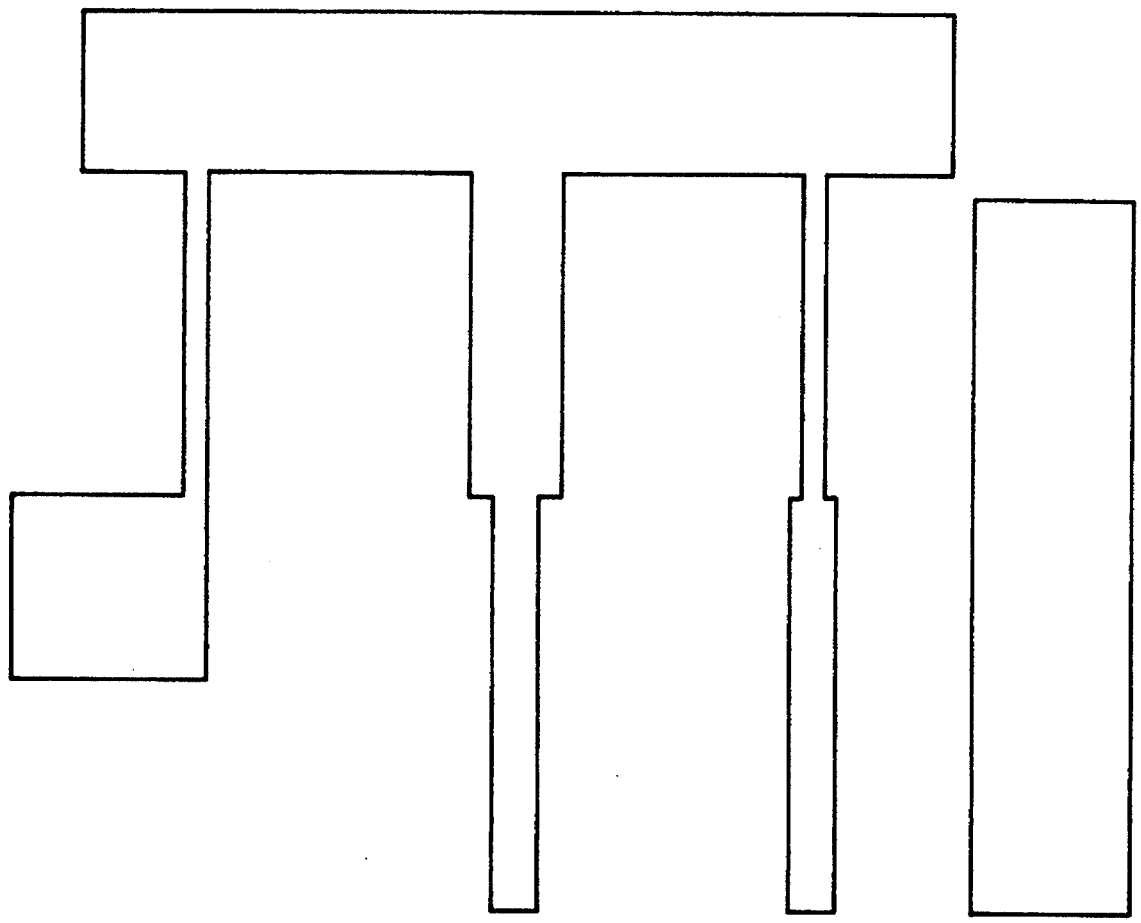
FIG. 3 is a plan view showing a sample pattern as encountered in VLSI circuit designs.
Figure 4:
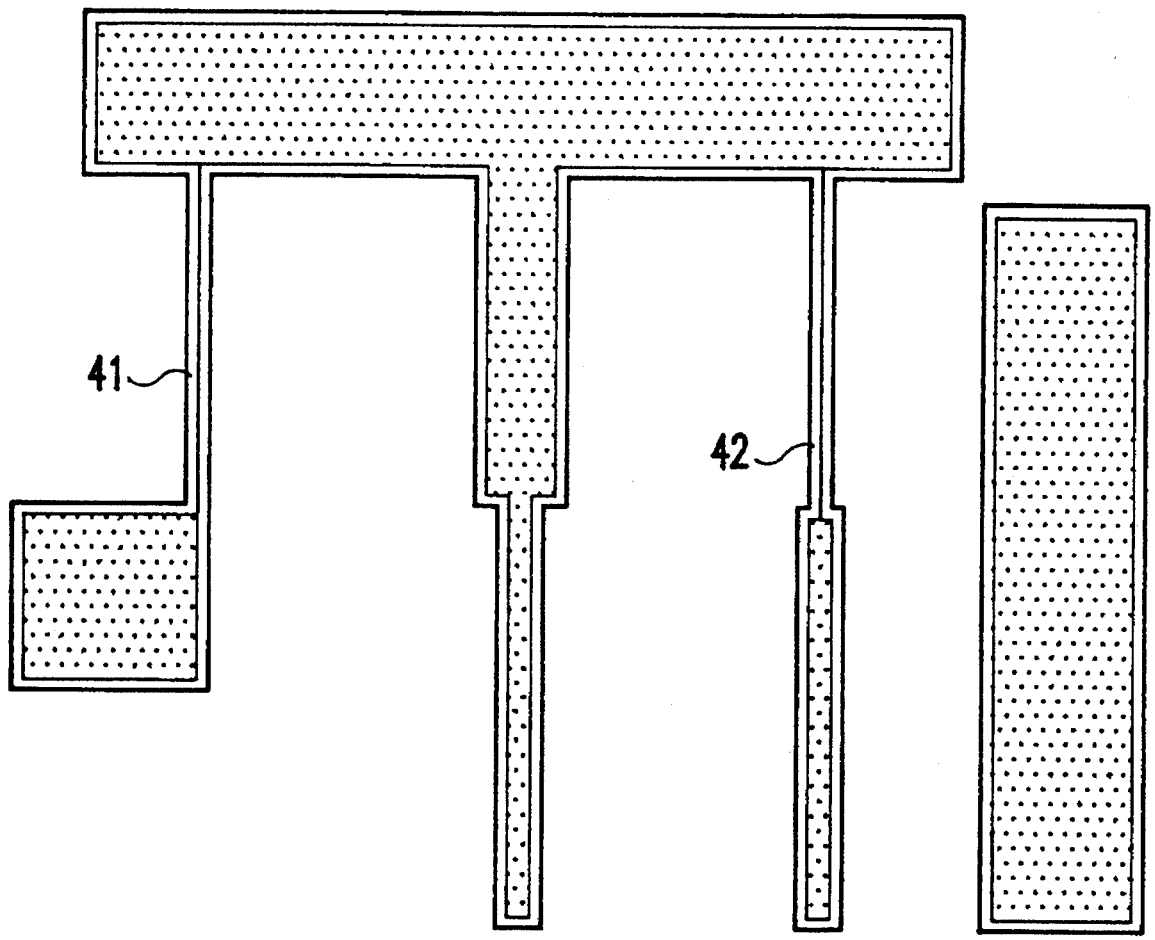
FIG. 4 is a plan view of the pattern shown in FIG. 3 subjected to a shrink operation.
Figure 5:
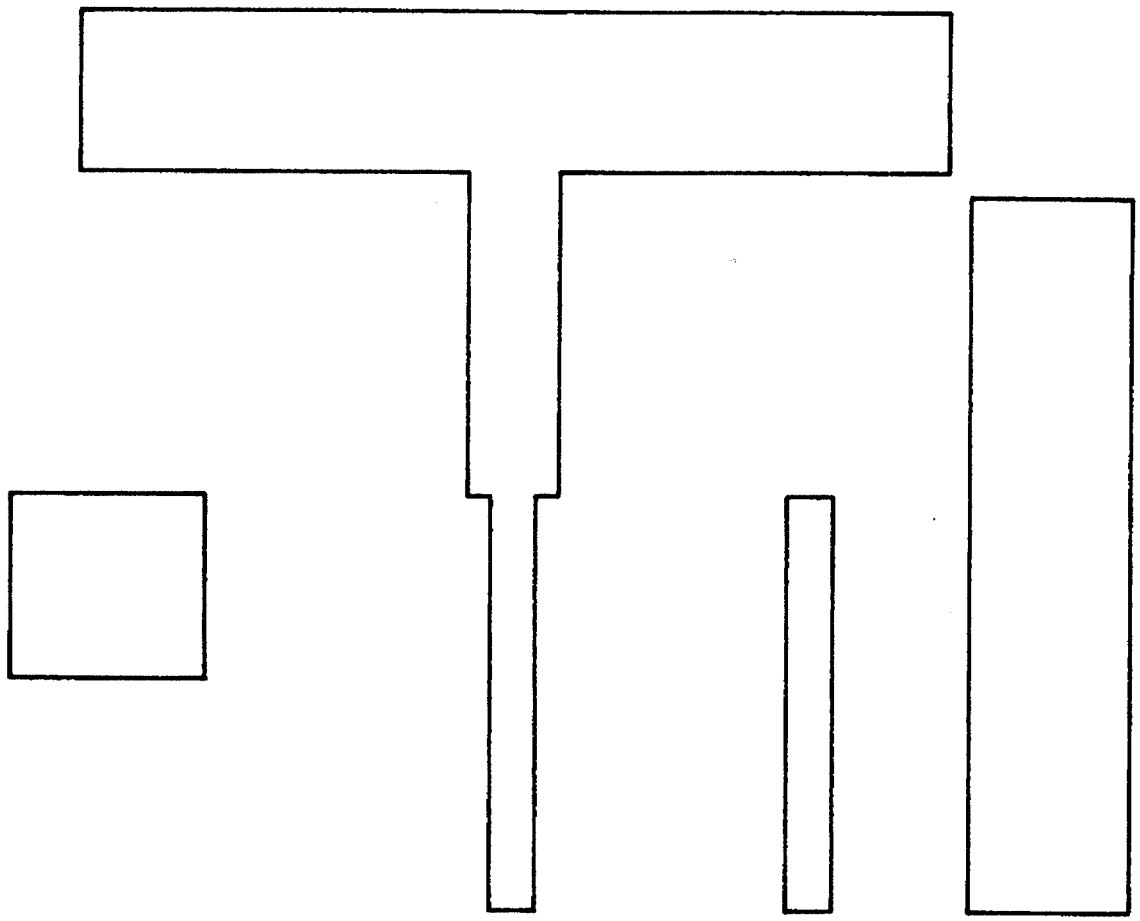
FIG. 5 is a plan view of the pattern shown in FIG. 4 expanded so that all patterns that survive the shrink operation are returned to their original size.
Figure 6:
FIG. 6 is a plan view of the original pattern shown in FIG. 3 from which the pattern of FIG. 5 has been subtracted.

The invention will be illustrated by way of example. Assume that a pattern such as illustrated in FIG. 3 is to be fractured into basic rectangles. This pattern will be referred to as pattern A and is obtained from the CAD data set for the VLSI circuit design being processed. Assume also that the minimum feature size is two design grids and the maximum feature size is ten design grids. Pattern A is subjected to a shrink operation to shrink the pattern by two design grids per edge, as shown in FIG. 4. Two sections of the pattern at 41 and 42 reduce to zero width lines and are lost to the CAD layout. After the shrink operation, the pattern is expanded back out by two design grids per edge. All patterns that survived the shrink operation are returned to their original size, as shown in FIG. 5, here referred to as pattern B. Next, by subtracting the pattern B (FIG. 5) from pattern A (FIG. 3), a difference pattern is obtained, as shown in FIG. 6. It will be observed that this difference pattern is the two lines 41 and 42 lost in the original shrink operation.

Figure 7:
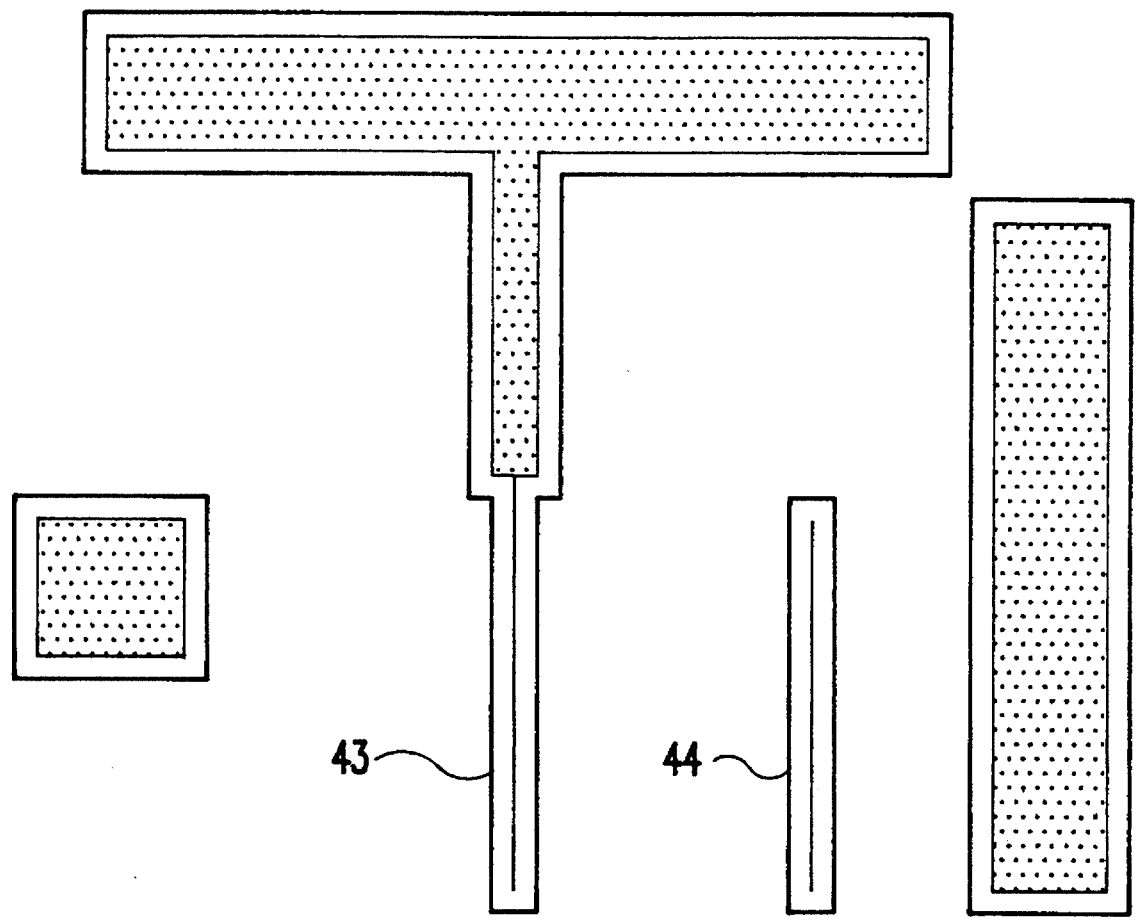
FIG. 7 is a plan view of the pattern shown in FIG. 5 subjected to a shrink operation.

Pattern B, shown in FIG. 5, is next subjected to a shrink operation to shrink the pattern by three design grids per edge, as shown in FIG. 7. Again, two sections of the pattern at 43 and 44 reduce to zero width lines and are lost in this operation. The resulting pattern is then expanded back out by three design grids per edge, to obtain pattern C shown in FIG. 8. Now, the original difference pattern shown in FIG. 6 is added to a second difference pattern obtained by subtracting pattern C (FIG. 8) from pattern B (FIG. 5) to obtain the pattern shown in FIG. 9. Note that in addition to the two lines 41 and 42 lost in the original shrink operation, this pattern also includes the two lines 43 and 44 lost in the second shrink operation. Note also that the two pairs of lines have, in effect, been sorted by size in this combination of operations.

Figure 8:
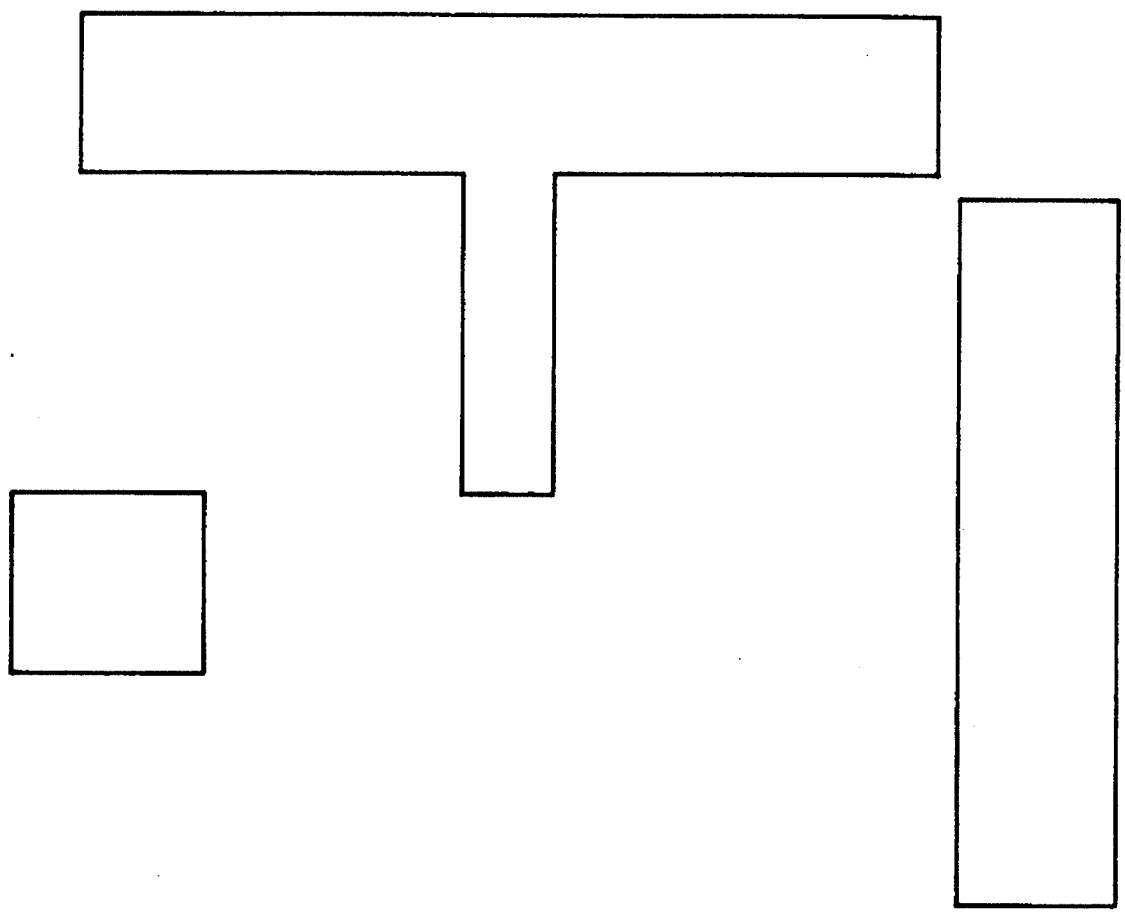
FIG. 8 is a plan view of the pattern shown in FIG. 7 expanded so that all patterns that survive the shrink operation are returned to their original size.
Figure 9:
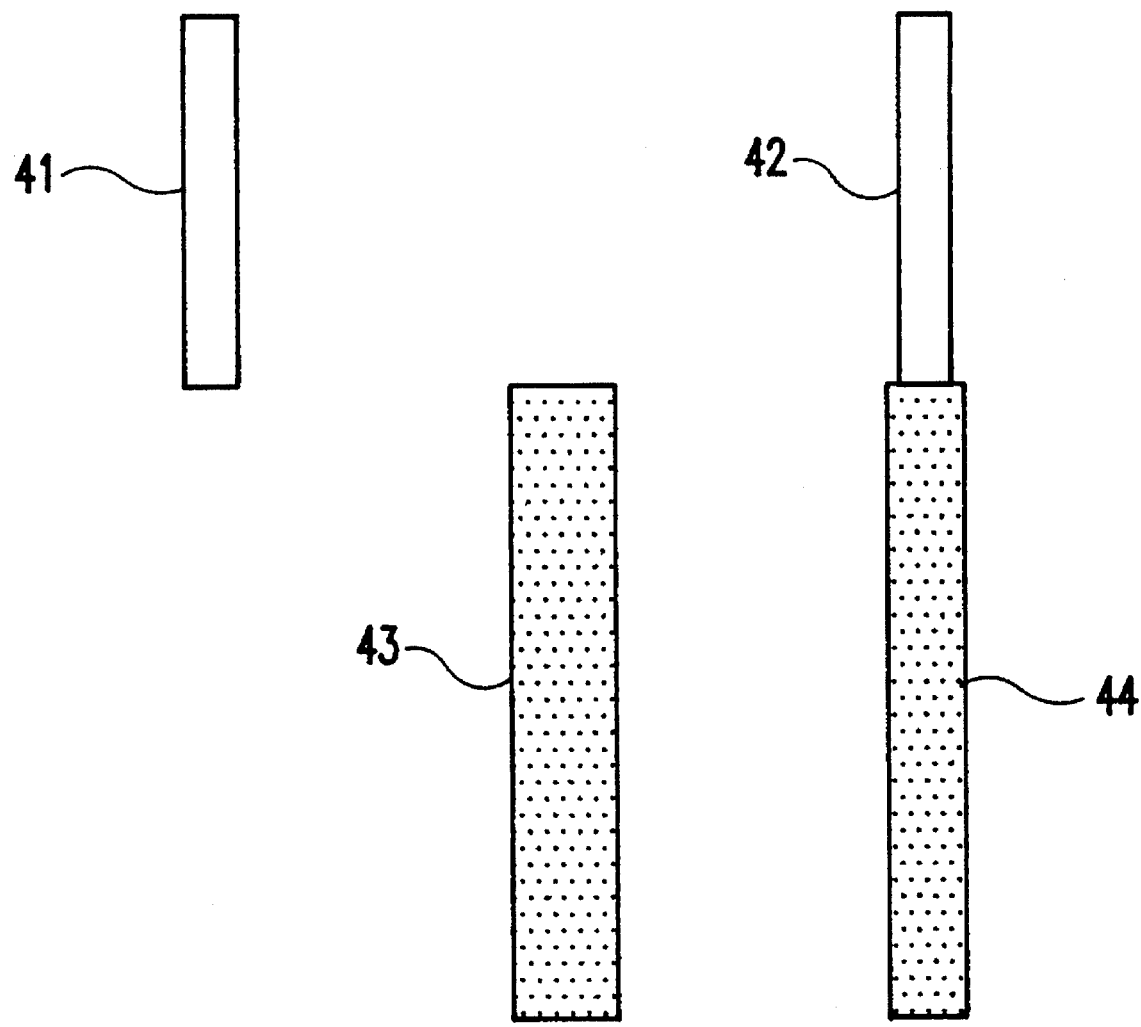
FIG. 9 is a plan view of the pattern shown in FIG. 6 plus the difference of the patterns shown in FIGS. 5 and 8.
Figure 10:
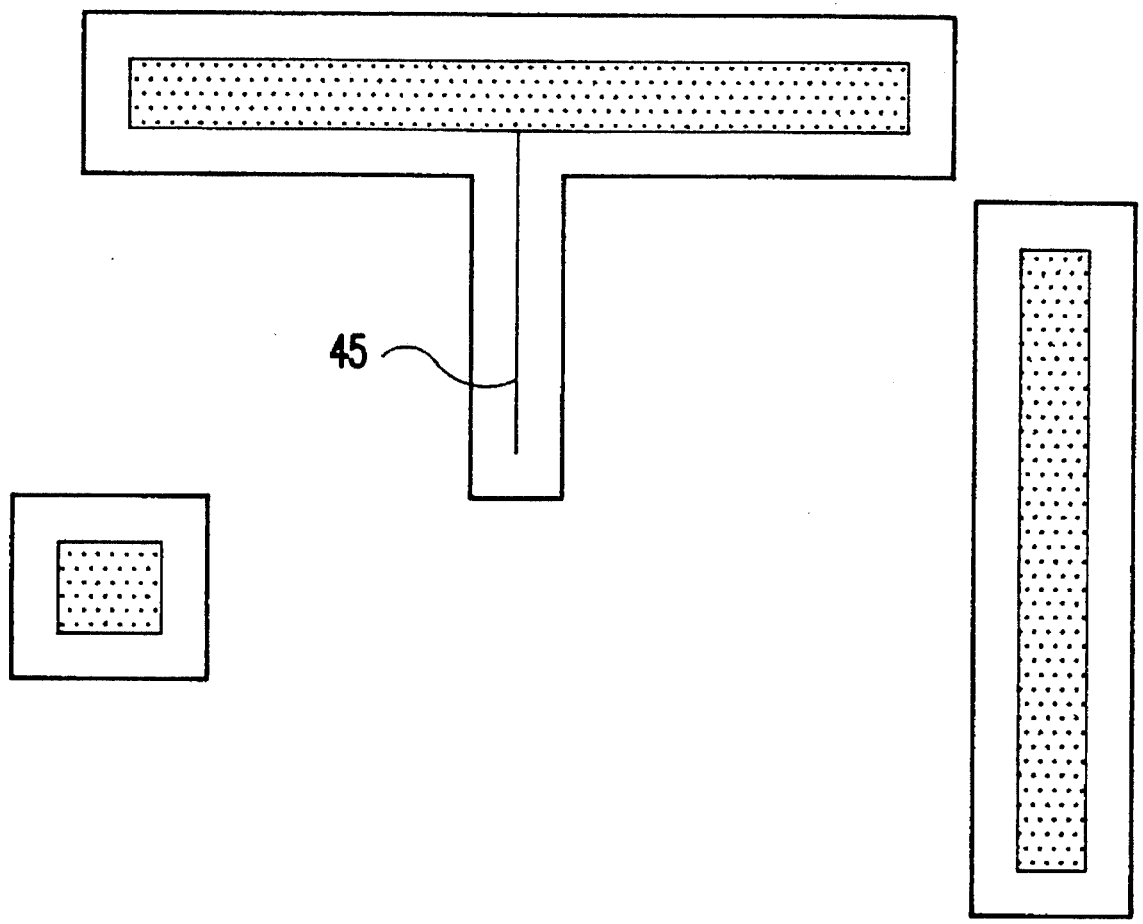
FIG. 10 is a plan view of the pattern shown in FIG. 8 subjected to a shrink operation.
Figure 11:
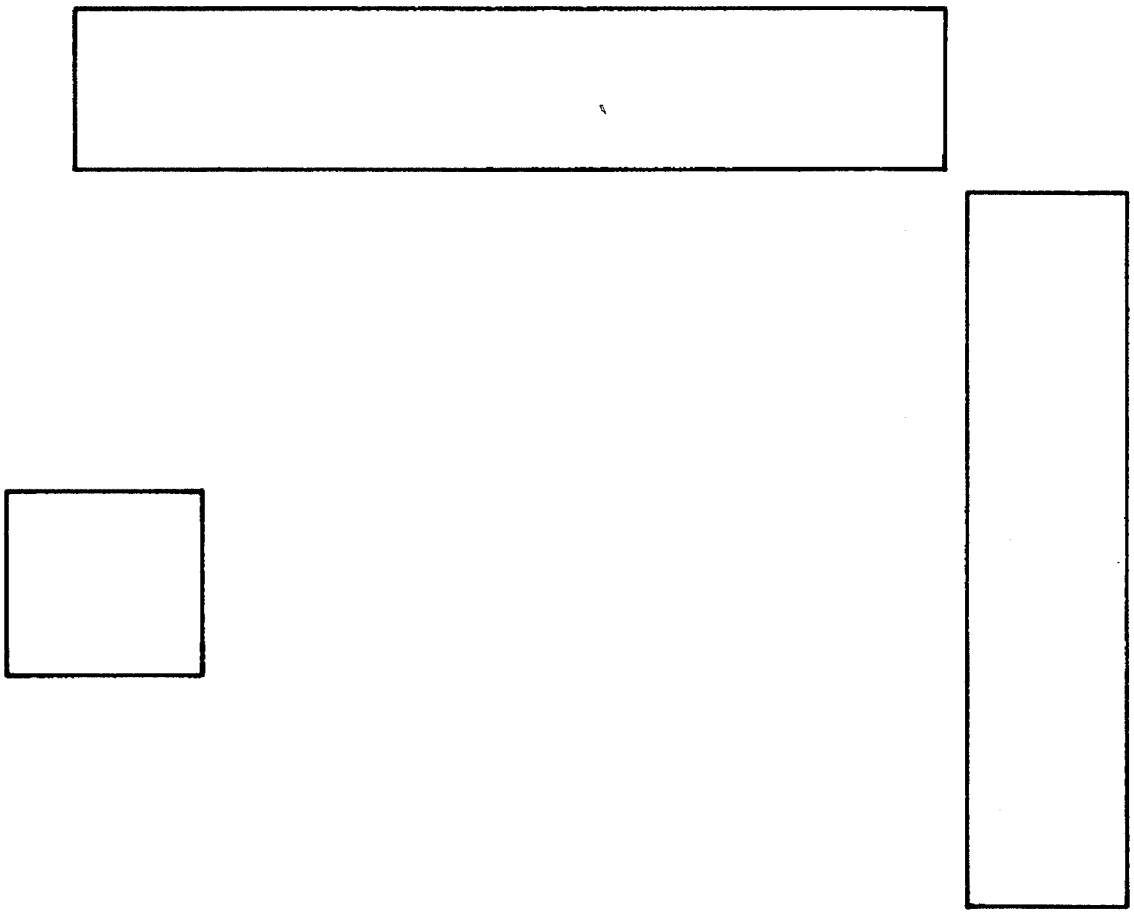
FIG. 11 is a plan view of the pattern shown in FIG. 10 expanded so that all patterns that survive the shrink operation are returned to their original size.

Pattern C, shown in FIG. 8, is next subjected to a shrink operation to shrink the pattern by four design grids per edge, as shown in FIG. 10. This time, one section of the pattern at 45 reduces to a zero width line. The resulting pattern is then expanded back out by four design grids per edge, to obtain pattern D shown in FIG. 11. Now, the sum of the difference patterns shown in FIG. 9 is added to a third difference pattern obtained by subtracting pattern D (FIG. 11) from pattern C (FIG. 8) to obtain the pattern shown in FIG. 12. Note that in addition to the lines 41, 42, 43, and 44 lost in the first two shrink operations, this pattern also includes line 45 lost in the third shrink operation. Again, the lines have, in effect, been sorted by size in this combination of operations. Since it is assumed that the maximum feature size is ten design grids, no further iterations of the shrink and expand process are required. This is because that a shrink operation of five design grids per edge is equal to the maximum feature size of ten design grids.

Figure 12:
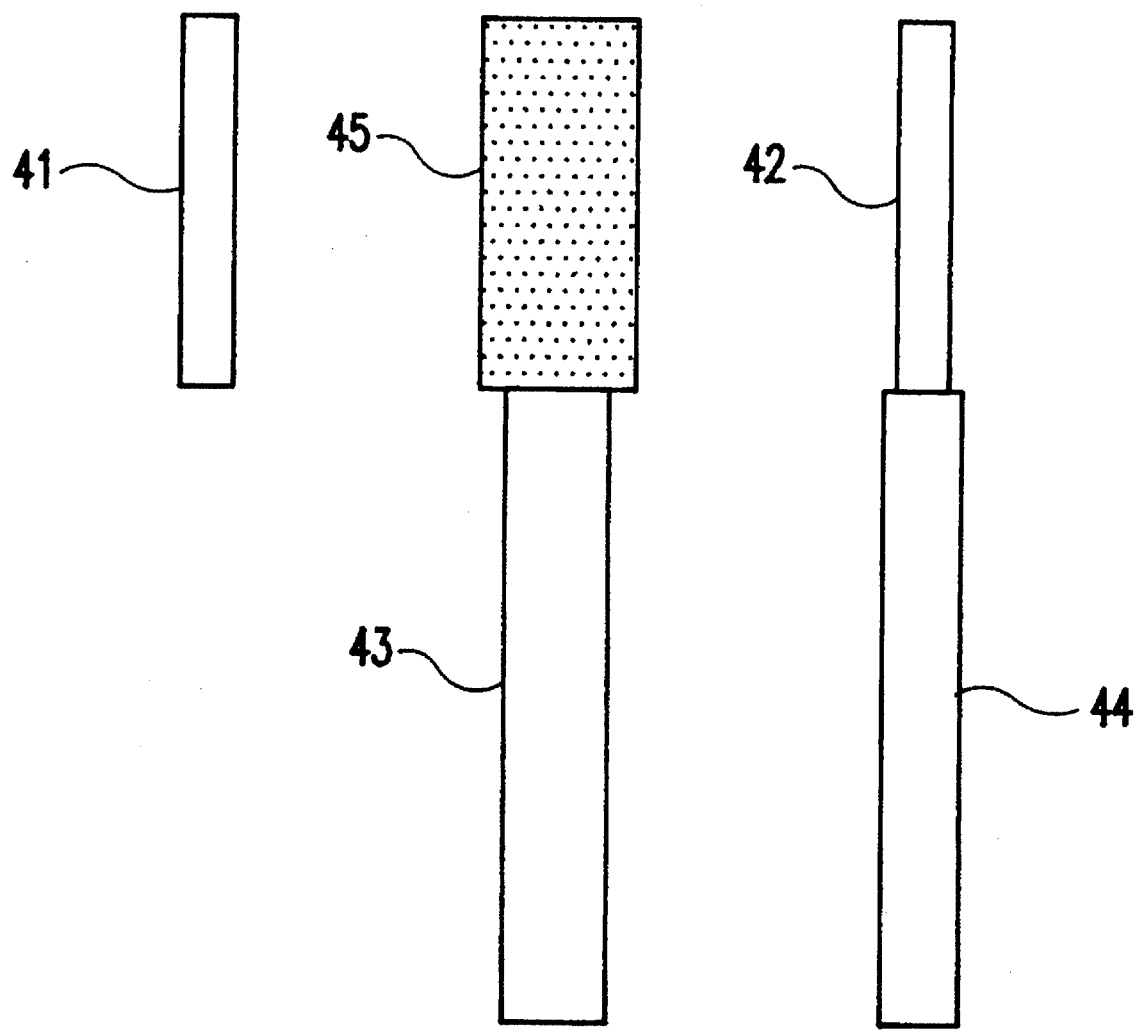
FIG. 12 is a plan view of the patterns shown in FIGS. 6 and 9 plus the difference in the patterns shown in FIGS. 8 and 11.
Figure 13:
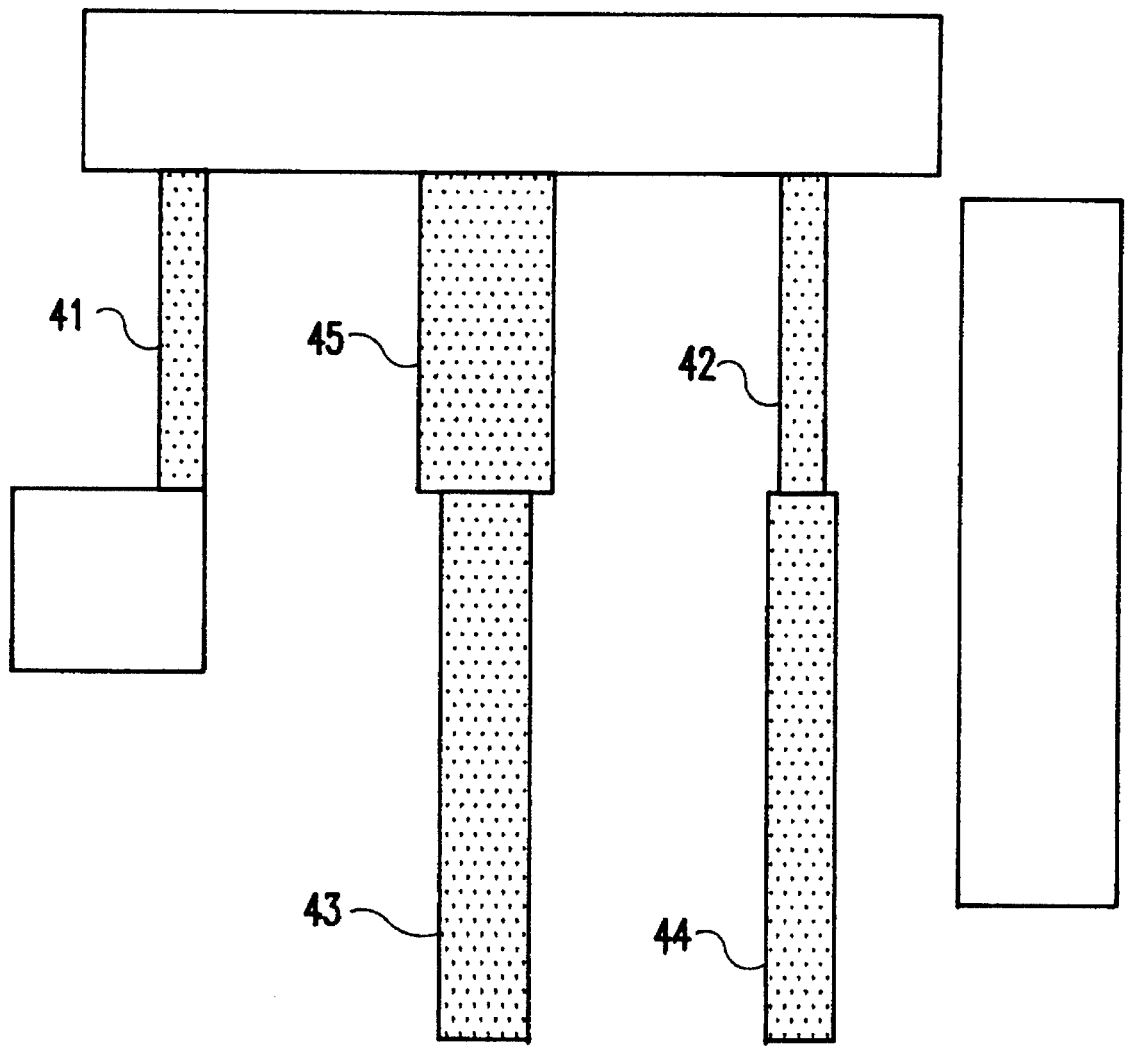
FIG. 13 is a plan view showing the composition of the original pattern shown in FIG. 3 fractured into basic rectangles.
Figure 14:
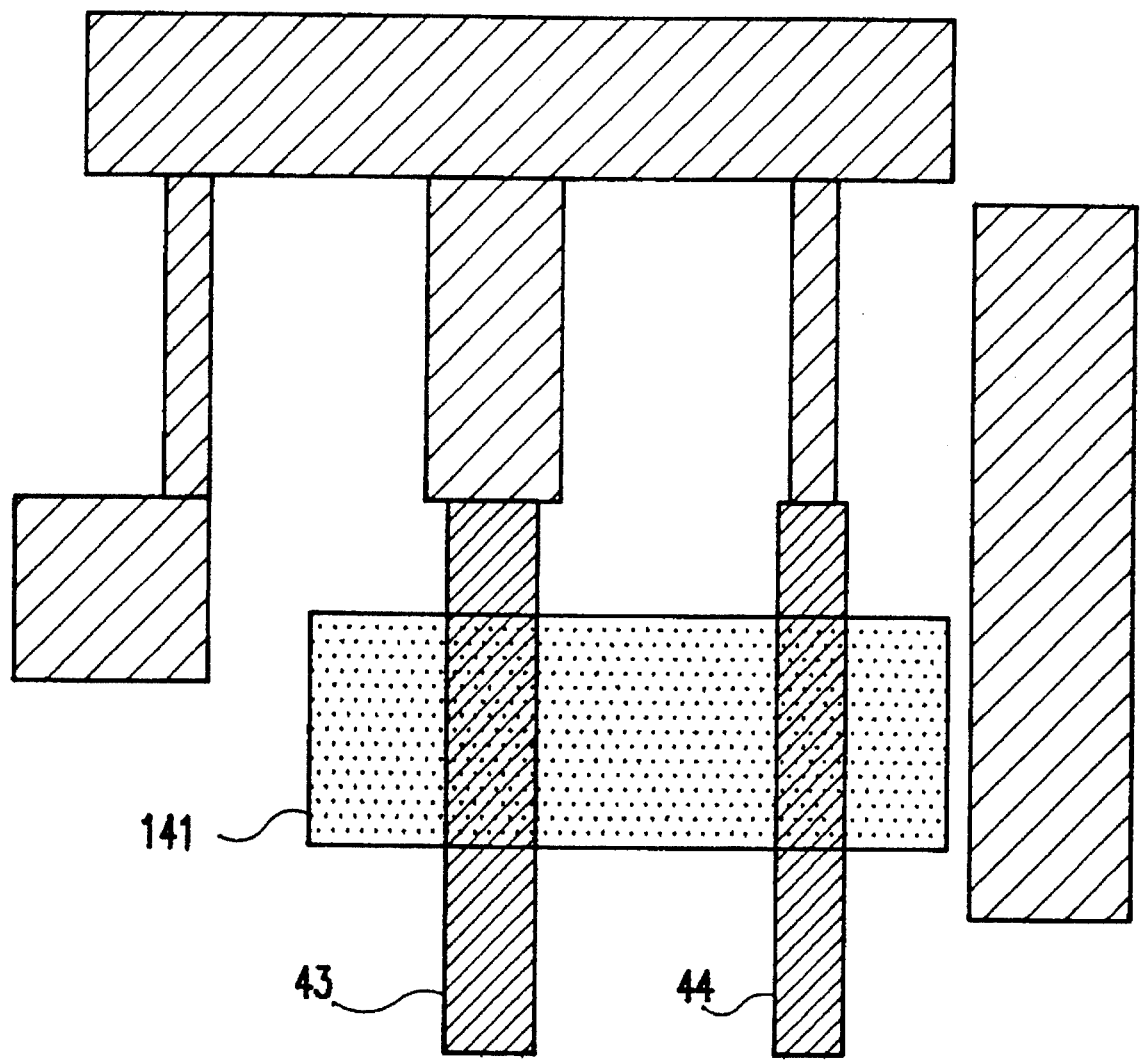
FIG. 14 is a plan view showing the selection process or two of the rectangles created in the fracturing procedure based on their interaction with a pervious CAD level.

Now, by taking the sum of the difference patterns in FIG. 12 and adding them to pattern D (FIG. 11) there is obtained the original pattern fractured into basic rectangles, as shown in FIG. 13. In this example, the polysilicon gate or GC level has been fractured into a set of simple rectangles. The next step is to select those rectangles created in the fracturing procedure which should be subject to OPC. This is done by examining the interaction of the rectangles with a previous CAD level, in this case the diffusion region, as shown in FIG. 14. The two rectangles 43 and 44 overlie the diffusion region 141 and are selected based on their interaction with that region. This is accomplished by a Boolean operation which identifies only the two rectangles 43 and 44 as interacting with the diffusion region 141.

Figure 15:
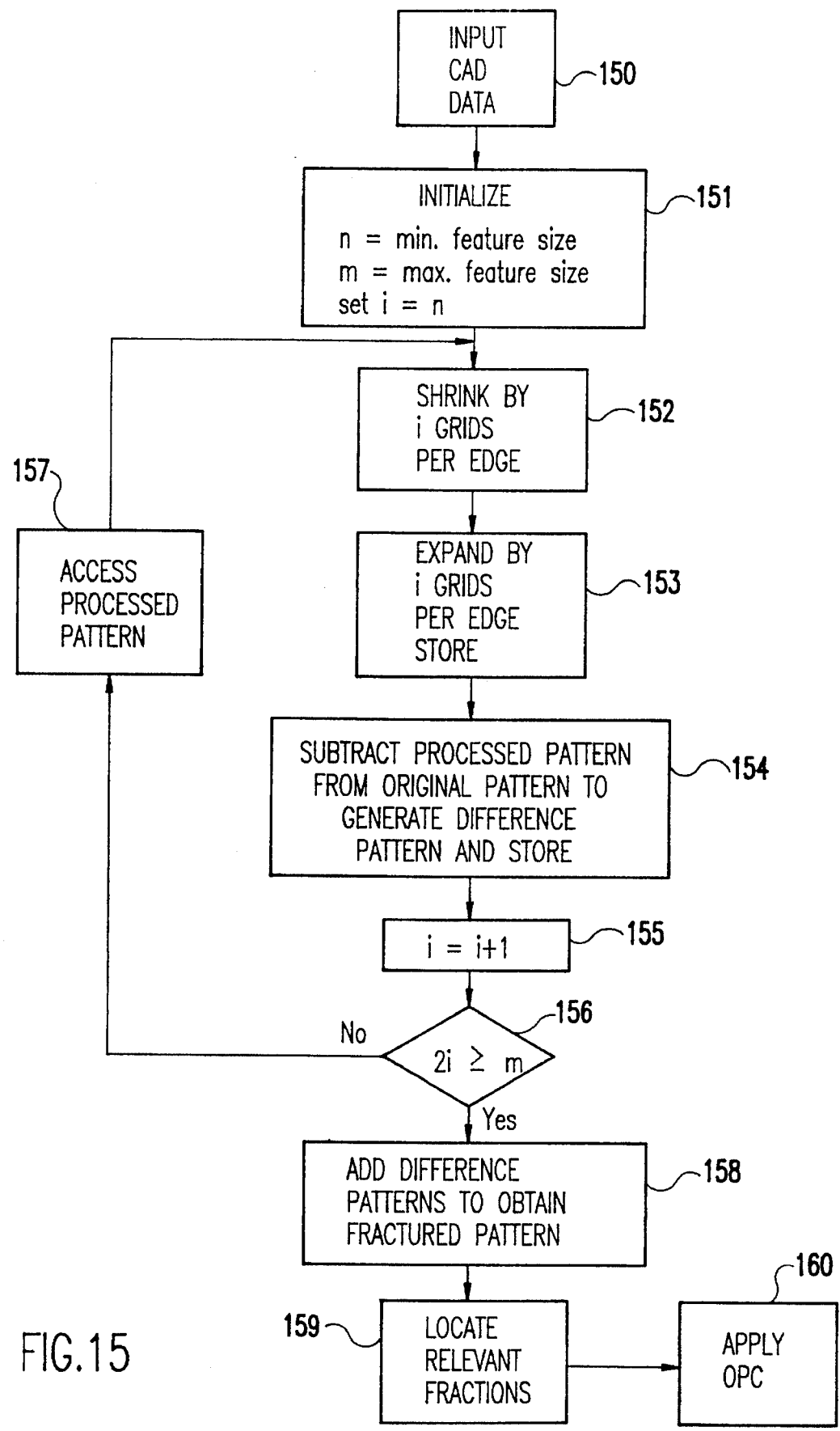
FIG. 15 is a flow diagram illustrating the basic process of the invention.

The process is summarized in the flow diagram of FIG. 15. The original CAD data is input in step 150. The CAD data set is subjected to the fracturing procedure as generally described above. More generally, it is assumed that the minimum feature size of the CAD design is a first predetermined size (e.g., two design grids in the example given above) and the maximum feature size is a second predetermined size (e.g., ten design grids in the example given above). The process is initialized in function block 151 by defining n as the minimum feature size, m as the maximum feature size, and setting i=n. Starting with the original design, the procedure goes through multiple iterations of shrinking, expanding and subtracting to obtain a series of patterns. First, the pattern is subjected to a shrinking operation in function block 152 to shrink the pattern by i design grids per edge. Second, the pattern is then expanded back in function block 153 by i design grids per edge to obtain a new pattern. This new pattern is temporarily stored. The pattern obtained in function block 154 is subtracted from the pattern input to function block 152 in function block 154 to obtain a difference pattern. This difference pattern is then temporarily stored. i is indexed by one in function block 155, and then a test is made in decision block 156 to determine if 2i is greater than or equal to m. If not, The pattern generated in function block 153 is accessed in function block 157, and the process loops back to function block 152 where the pattern generated by function block 153 is subjected to the shrink and expand operations of function blocks 152 and 153 prior to generated a new difference pattern in function block 154. When twice the index value i is greater than or equal to m, as determined by the test in decision block 156, then all the difference patterns are combined to obtain the fractured design in function block 158. Once the fractured design has been generated, relevant fractions are located in step 159. Boolean operations are used to locate critical features based on intersections with previous or subsequent design levels. In addition, proximity to other features on the same or other design levels can also be used to classify the fractured data pieces. Having now located the relevant fractions, OPC is applied to those fractions in step 160.

Figure 16:
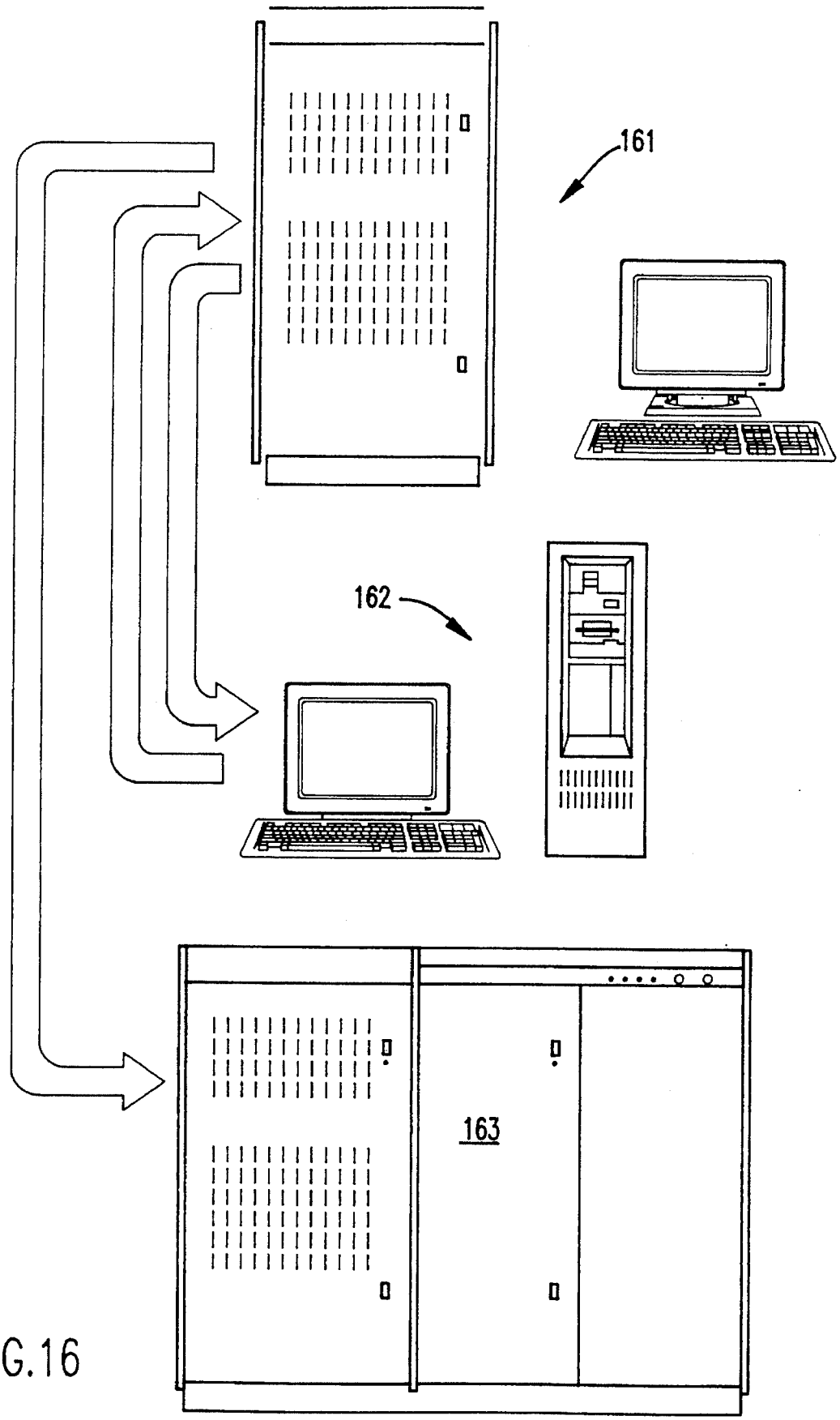
FIG. 16 is a block diagram showing representative hardware on which the invention may be implemented.

The invention may be implemented on the hardware shown in FIG. 16. The original CAD design for the chip is generated by a graphics design terminal 161, such as an IBM 6095 Graphics Design Terminal. The data set generated by terminal 161 is output to a workstation 162, such as an IBM RISC 6000 Workstation. The workstation operates as a shapes processor to first fracture the chip design as described above. Once the fracturing process is completed, the workstation then applies the OPC corrections to the data set. The thus modified data set is then output back to the terminal 161 on which the OPC corrections are reviewed. Once the OPC corrections have been reviewed and found acceptable, the data set is then output to a mainframe computer 163, such as an IBM ES/9000 computer. The mainframe computer 163 performs the postprocessing required to prepare the mask writer input data.

This method has been employed in the manufacture of a 64MB dynamic random access memory (DRAM) gate level and resulted in a ten per cent reduction in the data over biasing active gate regions only.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. An optical proximity correction method for controlling accuracy in VLSI patterning operations, said method comprising the steps of:

inputting an original design data set of a chip design;

subjecting a level of the input design data set to a fracturing procedure including a series of shrink, expand and subtraction operations to fracture the design data set into a plurality of basic geometric shapes abutting at vertices existent in the original design dam set;

sorting the plurality of basic geometric shapes by width;

locating and identifying relevant fractions of the sorted plurality of basic geometric shapes which are critical regions to the original design data set; and applying optical proximity correction biasing all of fractions having been identified as critical regions to the original design dam set.

2. The optical proximity correction method recited in claim 1 wherein the step of subjecting the input design data set to a fracturing procedure comprises the iterative steps of:

shrinking a first pattern by a predetermined amount equal to a minimum feature size in the level of the design;

expanding the pattern resulting from shrinking said first pattern by the predetermined amount to obtain a second pattern;

subtracting the second pattern from the first pattern to obtain a difference pattern; and repeating said shrinking, expanding and subtracting steps until a maximum feature size has been reached, thereby generating a plurality of difference patterns.

3. The optical proximity correction method recited in claim 2 wherein the step of subjecting the input design data set to a fracturing procedure further comprises the step of combining the plurality of difference patterns to obtain a fractured design of the original design data set.

4. The optical proximity correction method recited in claim 2 wherein the step of locating and identifying relevant fractions comprises the step of using Boolean operations to locate critical features based on intersections with previous or subsequent design levels.

5. The optical proximity correction method recited in claim 2 wherein the step of locating and identifying relevant fractions comprises the step of identifying critical features by proximity to other features on the same or other design levels.

* * * * *